US006608257B1

United States Patent
St. Cyr et al.

(10) Patent No.: US 6,608,257 B1
(45) Date of Patent: Aug. 19, 2003

(54) DIRECT PLANE ATTACHMENT FOR CAPACITORS

(75) Inventors: Valerie St. Cyr, Lincoln, MA (US); Istvan Novak, Maynard, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 109 days.

(21) Appl. No.: 10/021,769

(22) Filed: Dec. 12, 2001

(51) Int. Cl.[7] .................................................. H05K 1/02
(52) U.S. Cl. ........................... 174/255; 29/832; 361/763
(58) Field of Search ................................. 174/260, 261, 174/255; 361/763; 29/832, 846, 830

(56) References Cited

U.S. PATENT DOCUMENTS

| 5,235,496 | A | * | 8/1993 | Chomette et al. ........... 361/764 |
| 5,724,727 | A | * | 3/1998 | Chopra et al. ................ 29/832 |
| 5,832,596 | A | * | 11/1998 | Chiu ........................... 29/830 |
| 6,104,258 | A | | 8/2000 | Novak |
| 6,215,372 | B1 | | 4/2001 | Novak |
| 6,215,373 | B1 | | 4/2001 | Novak et al. |
| 6,337,798 | B1 | | 1/2002 | Hailey et al. |
| 6,395,996 | B1 | * | 5/2002 | Tsai et al. .................... 174/260 |
| 6,418,031 | B1 | | 7/2002 | Archambeault |

* cited by examiner

Primary Examiner—Albert W. Paladini
(74) Attorney, Agent, or Firm—Meyertons Hood Kivlin Kowert & Goetzel, P.C.; B. Noël Kivlin

(57) ABSTRACT

A method of direct plane attachment of capacitors is disclosed. In one embodiment, a printed circuit board (PCB) having a signal layer, a first conductive plane, and a second conductive plane is provided. The signal layer may be the outermost layer of the PCB, while the first conductive layer may be arranged between the signal layer and the second conductive layer. A cavity may be formed in the printed circuit board, wherein the cavity extends from the signal layer down to the first conductive plane. The cavity may be large enough to accommodate one or more capacitors. A first terminal of the capacitor may be attached to the first conductive plane. The second terminal of the capacitor may be mounted within an opening in the first conductive plane. The method may allow a bypass capacitor to be directly coupled to a power or reference plane.

44 Claims, 6 Drawing Sheets

DIRECT PLANE ATTACHMENT FOR CAPACITORS

BACKGROUND OF THE INVENTION

1. Field of the Invention

This invention relates to electronic circuits, and more particularly, to the mounting of bypass capacitors on a circuit carrier.

2. Description of the Relevant Art

In both analog and digital electronic systems it is necessary to provide power to active devices with a predefined ripple (i.e. low noise). Bypass capacitors are commonly used in electronic circuits in order to "bypass" noise caused by the operation of active devices. The use of bypass capacitors may allow an electronic system to have a low impedance in the power distribution system over a wide frequency range (i.e. wideband impedance). An essential factor in achieving wideband impedance is the minimization of attached inductance. Attached inductance is that inductance that may be present in the conductive elements of the capacitor (e.g. capacitor terminals) and the conductive planes to which the capacitor is electrically attached.

FIG. 1 illustrates a current loop that may be affected by the attached inductance for a capacitor that is electrically coupled to a power plane and a ground plane. Capacitor 10 is mounted upon printed circuit board (PCB) 5 at pads 8. One of pads 8 is connected to a ground plane through a first via 9, and the other pad 8 is connected to a power plane through a second via 9.

The current may circulate in a loop and encounter a loop impedance ($Z_{loop}$). Current may run along the inner contour of the bottom of the capacitor, continuing along the inner sides of the vias, and finally closing in on the plane below. The capacitor may be coupled to a pair of pads. One of the pads may be connected to the ground plane through a first via, while the other pad is connected to the power plane through a second via. In this particular example, the via connecting the second pad to the power plane may pass through an aperture in the ground plane known as an anti-pad.

The loop impedance, $Z_{loop}$, may be divided into two distinct impedances. The first impedance is a partial impedance through the dielectrics at the location of the anti-pad. The second impedance is the partial impedance encountered through the rest of the current loop. The first partial impedance may be referred to as plane impedance ($Z_P$) and the second partial impedance may be referred to as attached impedance ($Z_A$). The attached impedance may depend on the stack-up and geometry between the capacitor and the closest plane. Attached impedance may be independent of the plane separation, dielectric material between the power and ground planes, and the location on the surface of the plane.

Reduction of the attached inductance may be essential in controlling the impedance of the power distribution system, and may be accomplished by reducing the dimensions of the current loop. The dimensions of the current loop may be reduced by such methods as placing the vias closer together, using capacitors having a thin coating (e.g. the first capacitor plates are closer to the underlying planes), and/or placing the capacitors closer to the planes. The vias may be placed as close together as requirements for center-to-center spacing allow. Capacitor coating thickness may be minimized by using surface-mounted and/or thin-film capacitors. For typical surface-mounted capacitors, the coating thickness may be on the order of 5–15 mils. In thin-film capacitors, the coating thickness may be negligible in comparison with other dimensions in the current loop.

The capacitor itself may be placed closer to the planes when one of the planes is adjacent to the surface. However, considering the surface thickness of the dielectric material covering a plane adjacent to the surface as well as the thickness of the surface metallization, the distance between the bottom surface of the capacitor and the closest plane may still be on the order of several mils. In some instances, it may be possible to remove the dielectric material and assign the outermost metal layer as the power or ground plane. However, this may reduce the effectiveness of the plane, as the plane may be perforated by signal escape traces and their associated connecting pads.

SUMMARY OF THE INVENTION

A method of direct plane attachment of capacitors is disclosed. In one embodiment, a printed circuit board (PCB) having a signal layer, a first conductive plane, and a second conductive plane is provided. The signal layer may be the outermost layer of the PCB, while the first conductive layer may be arranged between the signal layer and the second conductive layer. A cavity may be formed in the printed circuit board, wherein the cavity extends from the signal layer down to the first conductive plane. The cavity may be large enough to accommodate one or more capacitors. A first terminal of the capacitor may be attached to the first conductive plane. The second terminal of the capacitor may be mounted within an opening in the first conductive plane. The method may allow a bypass capacitor to be directly coupled to a power or reference plane.

In another embodiment, the cavity may extend from the surface of the PCB to the second conductive plane. A capacitor may be mounted to the PCB within the cavity. The capacitor may include a first terminal attached directly to the first conductive plane and a second terminal attached directly to the second conductive plane.

In various embodiments, the capacitor mounted within the cavity may be a surface mounted capacitor, a thin-film capacitor, or a ball grid array (BGA) type capacitor. The terminals of the capacitor may be connected by soldering, by electrically conductive glue, or a pressure connection. A pressure connection may be formed by placing a capacitor terminal in direct contact with a conductive plane or a via, and holding the capacitor in place with non-conductive glue.

In some embodiments, the first conductive plane may be a ground (or reference) plane while the second conductive plane may be a power plane. In other embodiments, the first conductive plane may be a power plane and the second conductive plane may be a ground plane. The conductive planes may be separated by a layer of dielectric material.

Using the method described herein, a plurality of capacitors may be attached to a conductive plane of a printed circuit board. By attaching capacitors directly to the conductive plane, the dimensions of the current loop may be made smaller, thereby reducing the impedance associated with attached inductance.

BRIEF DESCRIPTION OF THE DRAWINGS

Other aspects of the invention will become apparent upon reading the following detailed description and upon reference to the accompanying drawings in which.

Figure 1:
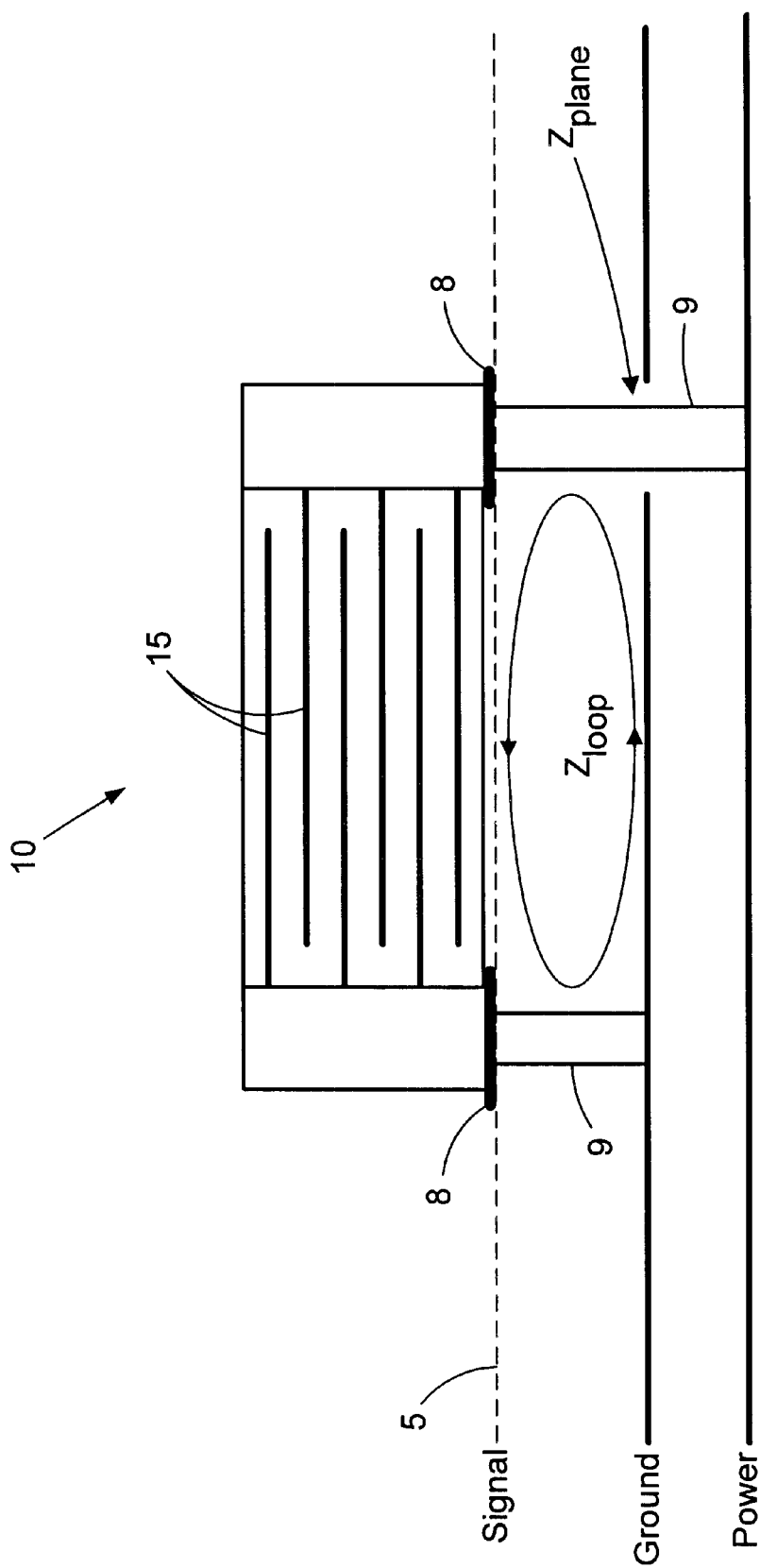
FIG. 1 (Prior Art) is a side view of one embodiment of a capacitor attached to a printed circuit board (PCB), the view illustrating the loop impedance.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION

Figure 2:
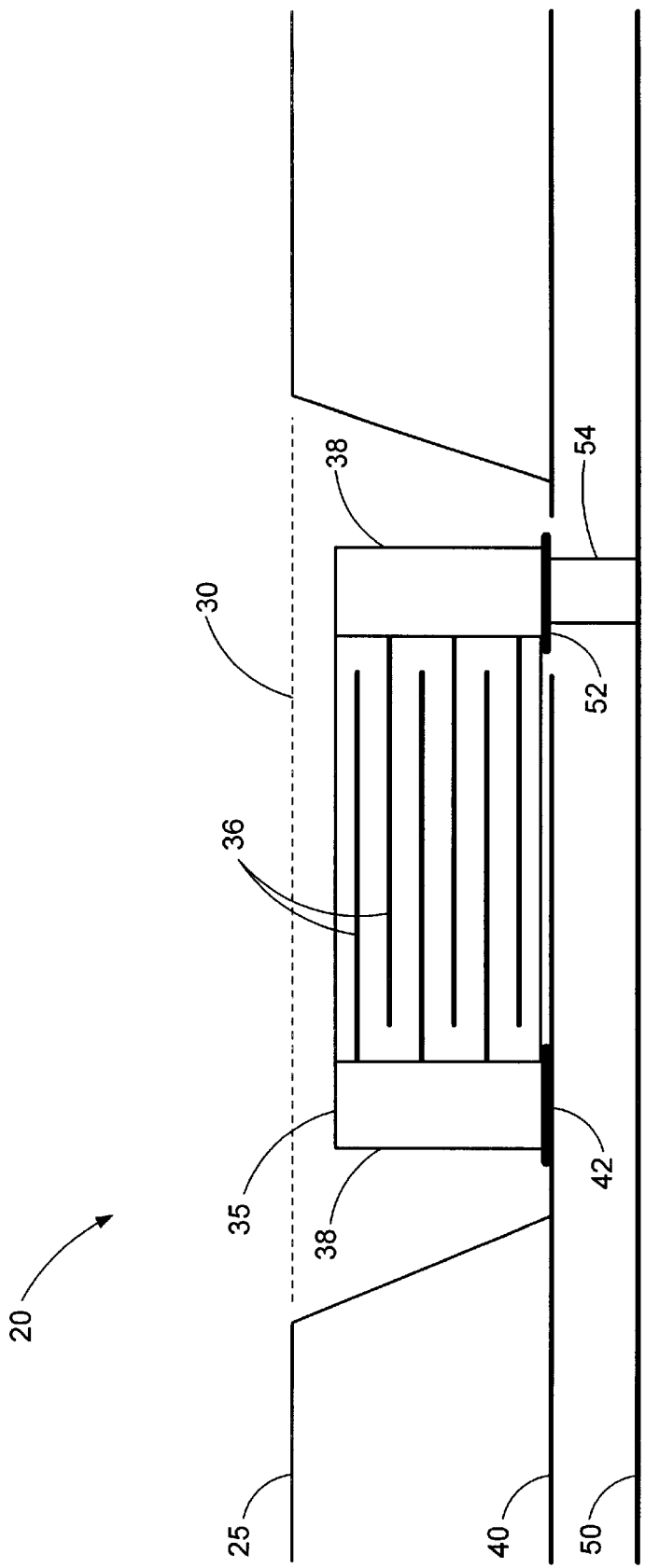
FIG. 2 is a side view of one embodiment of a PCB having a capacitor attached directly to a conductive plane, wherein the capacitor is placed within a cavity extending from the surface of the PCB down to the first conductive plane.

Turning now to FIG. 2, a side view of one embodiment of a printed circuit board having a capacitor attached directly to a conductive plane, wherein the capacitor is placed within a cavity extending from the surface of the PCB down to the first conductive plane is shown. PCB 20 includes a surface (e.g. signal) layer 25, a first conductive plane 40, and a second conductive plane 50. The conductive planes may be separated from each other by a dielectric material. Signal layer 25 may also be separated from first conductive plane 40 by a dielectric material. In some embodiment, additional signal layers may be present between the signal layer 25 (on the surface of the board) and first conductive plane 40. In one embodiment, first conductive plane 40 and the second conductive plane 50 may be ground and power planes, respectively. In other embodiments, first conductive plane 40 may be a power plane and second conductive plane 50 may be a ground plane. In general, first conductive plane 40 and second conductive plane 50 are part of the power distribution system, with a voltage difference existing between them. One of the conductive planes serves as a voltage plane, while the other conductive plane serves as a reference plane.

In the embodiment shown, PCB 20 includes a cavity 30. Cavity 30 extends from the surface of PCB 20 down to first conductive plane 40. In one embodiment, the depth of cavity 30 may be approximately equal to the thickness of the outer layer of coating of PCB 20. In some embodiments, the width of cavity 30 may be large enough to accommodate a single capacitor, while in other embodiments, cavity 30 may be large enough to accommodate multiple capacitors.

Capacitor 35 is mounted to PCB 20 within cavity 30. In the embodiment shown, capacitor 35 is a surface mount technology (SMT) capacitor, which includes multiple conductive plates 36 within its body. Other types of capacitors may also be used, such as thin-film capacitors, ball-grid array (BGA) capacitors, and multi-terminal capacitors.

Capacitor 35 may include a pair of terminals 38. A first one of the terminals 38 may be mounted to pad 42, which is part of first conductive plane 40. In this manner, capacitor 35 is directly attached to first conductive plane 40 at the first of terminals 38. In some embodiments, a pad such as pad 42 may not be present or necessary. A second terminal 38 is attached to pad 52, which is located within the periphery of an opening in the second conductive plane. Pad 52, and therefore the second of terminals 38, is electrically coupled to second conductive plane 50 through via 54.

By attaching a terminal directly to a conductive plane, the inductance in the current loop between power and ground planes may be reduced. Since one terminal is directly attached to a conductive plane, only one via is needed to attach the other terminal to a conductive plane. Furthermore, the via may be of a shorter length due to the direct attachment of one of the terminals. Thus, the current path between the power and ground planes may be significantly shorter, which may result in a lower inductance.

Various means of connecting capacitor terminals may be utilized. Such methods include, but are not limited to soldering, using electrically conductive glue, or using a pressure connection. For two-terminal capacitors, it is not necessary that both terminals be connected to their respective pads (or conductive plane, if directly attached) by the same means. For example, one terminal of a capacitor may be connected by electrically conductive glue, while the other terminal may be connected by soldering. Similarly, it is not necessary to connect all terminals by the same means for capacitors having more than two terminals.

Figure 3:
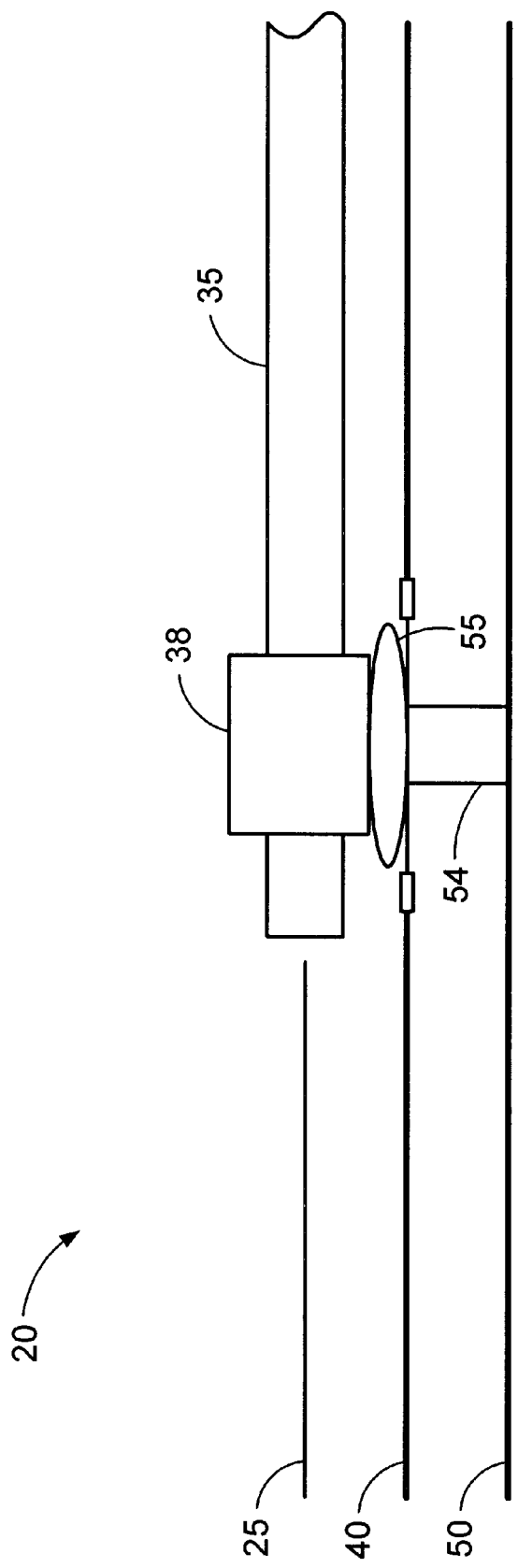
FIG. 3 is a side view of one embodiment of a capacitor attached to a via by a solder ball.

Moving now to FIG. 3, a side view of one embodiment of a capacitor attached to a via by a solder ball is shown. Capacitor 35 may be a ball-grid array capacitor, and may include a first terminal 38 which is attached to via 54 by a solder ball 55. The capacitor may be coupled to first conductive plane 50 by connecting via 54 to first terminal 38 using solder ball 55. A second terminal of the capacitor may be directly coupled to second conductive plane 40 as shown in FIG. 2.

Figure 4:
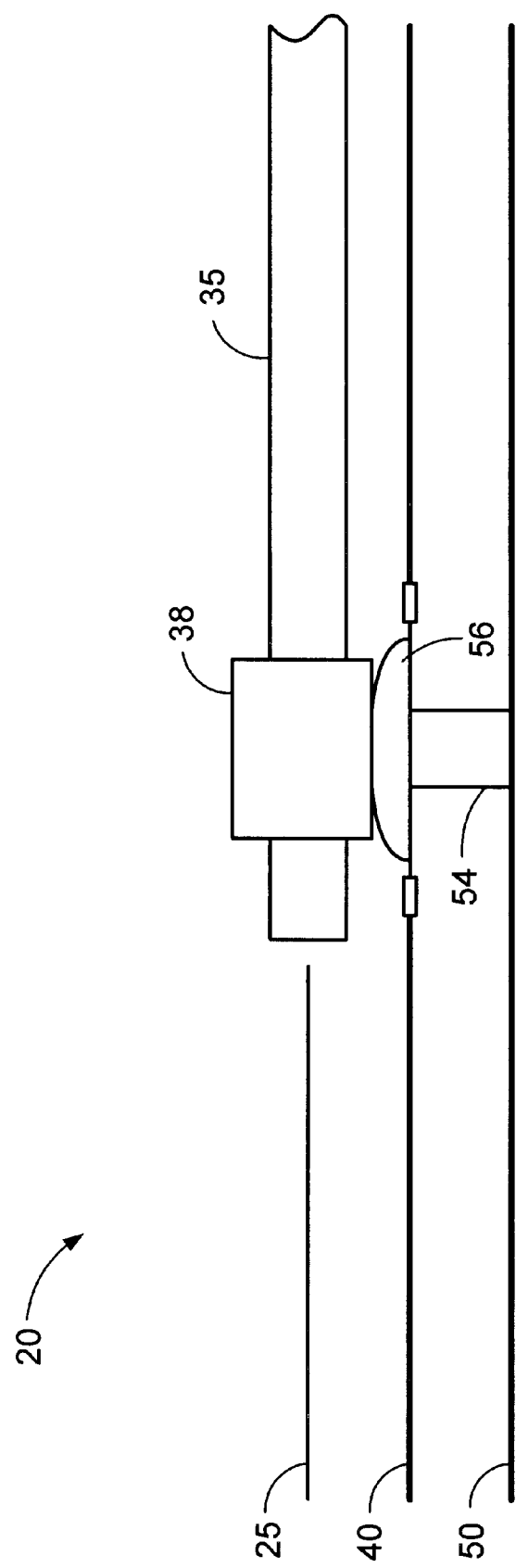
FIG. 4 is a side view of one embodiment of a capacitor attached to a via by conductive glue.

FIG. 4 is a side view of one embodiment of a capacitor attached to a via by conductive glue. The embodiment shown in FIG. 4 may be identical to that shown in FIG. 3 with the exception that first terminal 38 is attached to via 54 by conductive glue 56. Conductive glue 56 is an electrically conductive glue, and may be more suitable than a solder ball for some applications. A second terminal may be directly attached to a second conductive plane by conductive glue or other means (e.g. solder ball).

Figure 5:
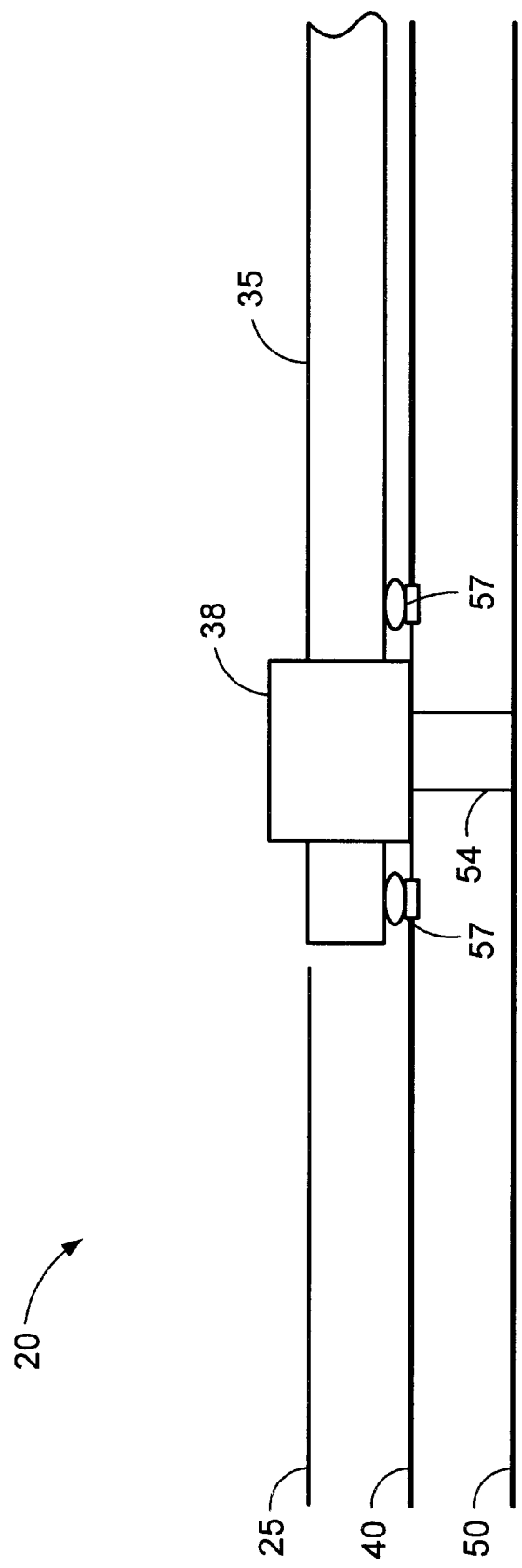
FIG. 5 is a side view of one embodiment of a capacitor attached to a via, wherein a pressure contact exists between the capacitor and the via.

FIG. 5 is a side view of one embodiment of a capacitor attached to a via, wherein a pressure contact exists between the capacitor and the via. In this particular embodiment, first terminal 38 of capacitor 35 is held in direct contact with via 54. Two beads of non-conductive glue 57 may be used to keep the capacitor in place and the terminal in contact with the via.

Figure 6A:
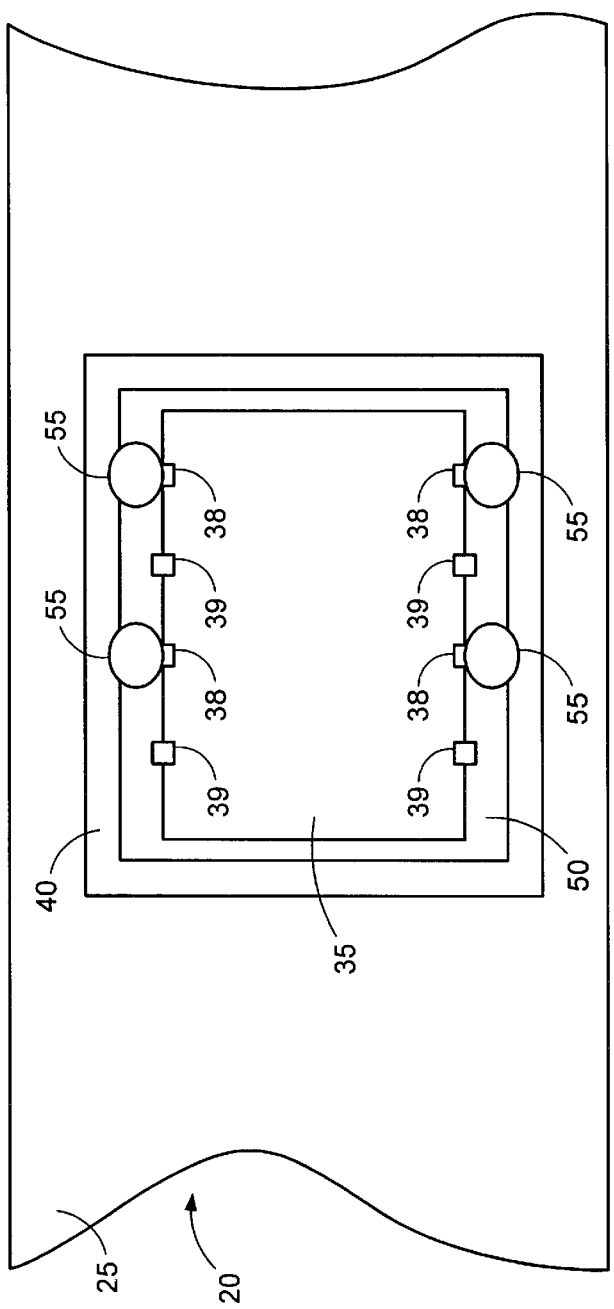
FIG. 6A is a top view of an embodiment wherein all terminals of a capacitor are directly attached to a conductive plane.
Figure 6B:
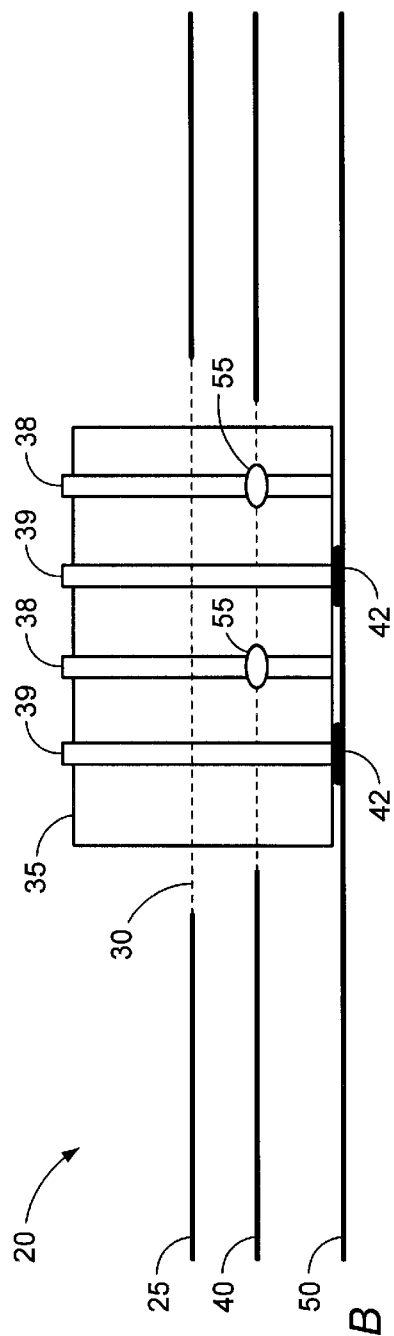
FIG. 6B is a side view of an embodiment wherein all terminals of a capacitor are directly attached to a conductive plane.

Turning now to FIG. 6A, a top view of an embodiment wherein all terminals of a capacitor are directly attached to a conductive plane is shown. FIG. 6B is a side view of the same embodiment wherein all terminals of a capacitor are directly attached to a conductive plane. In the embodiment shown in these two drawings, capacitor 35 is mounted to PCB 20 within a cavity 30. Cavity 30 in this embodiment extends from signal layer 25, through first conductive plane 40, and down to second conductive plane 50. Capacitor 35 includes a number of first terminals 38 and a number of second terminals 39. First terminals 38 are directly attached to first conductive plane 40, while second terminals 39 are directly attached to second conductive plane 50. Thus, in contrast to the embodiments presented above, all capacitor terminals in this embodiment are directly attached, and no vias are required in order to connect a capacitor terminal to a conductive plane.

First terminals 38 and second terminals 39 may be attached to their respective conductive planes by various methods. In the embodiment shown, first terminals 38 are coupled to first conductive plane 40 by solder balls 55. Other embodiments are possible and contemplated wherein first terminals 39 are attached to first conductive plane 40 by electrically conductive glue. A pressure contact, whereby the terminal is held in direct contact with the conductive plane by pressure, may also be used to connect first terminal 39 and conductive plane 40. Similarly, second terminals 39 may be attached to second conductive plane 50 by soldering, conductive glue, or pressure contact. It should also be noted that it is not necessary for first terminals 38 and second terminals 39 to be attached to their respective conductive planes by the same method. For example, first terminals 38 may be attached to first conductive plane 40 by soldering while second terminals 39 are attached to second conductive plane 50 by conductive glue.

Embodiments such as those shown in FIGS. 6A and 6B may result in a very low inductance current path. In these embodiments, all capacitor terminals are directly attached to a conductive plane, such as a power plane or ground plane. Thus, no vias are required for connecting terminals to their respective conductive planes, thereby shortening even further the current path between the conductive planes. By reducing the inductance of the current path between conductive planes, it may be easier to achieve the desired wideband impedance for power distribution systems.

Various methods may be employed to manufacture the printed circuit board upon which capacitors will be mounted directly to a conductive plane. Table 1 below presents one such manufacturing method.

TABLE 1

A) Select a Core which is a dielectric with copper cladding both sides
   a. Copper thickness may range from 12 to 50 um, application specific
   b. Copper foil orientation is customarily "smooth side down/tooth out"
   c. Dielectric thickness may range from 8 um to 75 um, appl specific
   d. Dielectric materials can be: polyimide, BT, epoxy glass reinforced, others
B) Process Core
   a. Cut and Preclean
   b. Coat with Resist
   c. Pattern image and develop
      1.) Layer 2 image has cross-hair targets 3 places at extremes of PCB
      2.) There are target pads for the vias on Lyr 2: e.g. .012"
      3.) The target pads set inside antipads: e.g. .022"
   d. Etch pattern
   e. Resist strip
   f. No Oxide process step
C) Form Via
   a. Stack Cores & Pin or fixture to CNC driller
   b. Drill the through vias e.g. .008" dia
   c. Chemical Clean
D) Fill Via
   a. Place Core onto table with underside vacuum
   b. Dispense or screen print conductive fill
      1.) Selection criteria includes: Shrinkage, retention, malleability, compatibility with lamination temperatures, corrosiveness, brittleness etc.

TABLE 1-continued c. Cure fill material
   d. Screen print epoxy or dispense fill into antipad
   e. Planarize
E) Diecut or rout to size cavity clearance(s) and cross-hair target openings in "low flow" prepreg
F) Build multiplayer book where
   a. Layer 1 and last conductive layer (N) are one-ounce copper foil
   b. L1–L2 prepreg is approximately .003" thick
   c. Core is 2/3 and/or N-1/N-2
G) Laminate, Drill, E'less, Image, Pattern Plate, Strip and Etch, Surface Finish, Soldermask and Nomenclature, Rout
H) Cut away L1 to expose L2 cavity w/ features
   a. After Rout (at CNC drill or rout or other dedicated inverse spindle): use "controlled depth" foot attachment (pulse to establish surface) and expose layer 2 features with mini-end mill operation (e.g; .040" dia
I) Dispense conductive glue dots onto pads underside of cap
J) Place component, with slight pressure using crosshairs on L2 to establish location and orientation
K) Fill cavity perimeter opening with epoxy
L) Test While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A printed circuit board comprising:
   a capacitor having a first terminal and a second terminal;
   a first signal layer, wherein the first signal layer is the outermost layer of the printed circuit board;
   a first conductive plane and a second conductive plane, wherein the first conductive plane is arranged between the first signal layer and the second conductive plane;
   wherein the printed circuit board includes at least one cavity, wherein the cavity extends from the first signal layer to the first conductive plane;
   wherein the first terminal of the capacitor is directly attached to the first conductive plane; and
   wherein the second terminal of the capacitor is mounted within an opening in the first conductive plane and electrically coupled to the second conductive plane by a via.

2. The printed circuit board as recited in claim 1, wherein the second terminal of the capacitor is connected to the via by electrically conductive glue.

3. The printed circuit board as recited in claim 1, wherein the second terminal of the capacitor is coupled to the via by soldering.

4. The printed circuit board as recited in claim 1, wherein the second terminal of the capacitor is coupled to the via by a pressure connection.

5. The printed circuit board as recited in claim 1, wherein the first conductive plane includes a pad, and wherein the first terminal is connected to the pad.

6. The printed circuit board as recited in claim 5, wherein the first terminal is connected to the pad by soldering.

7. The printed circuit board as recited in claim 5, wherein the first terminal is connected to the pad by electrically conductive glue.

8. The printed circuit board as recited in claim 5, wherein the first terminal is connected to the pad by a pressure connection.

9. The printed circuit board as recited in claim 1, wherein the capacitor is a surface mounted capacitor.

10. The printed circuit board as recited in claim 1, wherein the capacitor is a thin-film capacitor.

11. The printed circuit board as recited in claim 1, wherein the capacitor is a ball-grid array capacitor.

12. The printed circuit board as recited in claim 1, wherein the first conductive plane is a power plane and the second conductive plane is a ground plane.

13. The printed circuit board as recited in claim 1, wherein the first conductive plane is a ground plane and the second conductive plane is a power plane.

14. A method for directly attaching a capacitor to a conductive plane of a printed circuit board, the method comprising:

providing a printed circuit board, the printed circuit board having a first signal layer, wherein the first signal layer is the outermost layer of the printed circuit board, and wherein the printed circuit board also includes a first conductive plane and a second conductive plane, the first conductive plane arranged between the second conductive plane and the first signal layer;

forming a cavity in the printed circuit board, wherein the cavity extends from the first signal layer to the first conductive plane;

placing a capacitor in the cavity;

directly attaching a first terminal of the capacitor to the first conductive plane;

placing a second terminal of the capacitor within the periphery of an opening of the first conductive plane; and electrically coupling the second terminal of the capacitor to the second plane by a via.

15. The method as recited in claim 14, wherein in the second terminal of the capacitor is connected to the via by electrically conductive glue.

16. The method as recited in claim 14, wherein the second terminal of the capacitor is connected to the via by soldering.

17. The method as recited in claim 14, wherein the second terminal of the capacitor is connected to the via by a pressure connection.

18. The method as recited in claim 14 further comprising connecting the first terminal to a pad located on the first conductive plane.

19. The method as recited in claim 18, wherein the first terminal is connected to the pad by soldering.

20. The method as recited in claim 18, wherein the first terminal is connected to the pad by electrically conductive glue.

21. The method as recited in claim 18, wherein the first terminal is connected to the pad by a pressure connection.

22. The method as recited in claim 14, wherein the capacitor is a surface mounted capacitor.

23. The method as recited in claim 14, wherein the capacitor is a thin-film capacitor.

24. The method as recited in claim 14, wherein the capacitor is a ball-grid array capacitor.

25. The method as recited in claim 14, wherein the first conductive plane is a power plane and the second conductive plane is a ground plane.

26. The method as recited in claim 14, wherein the first conductive plane is ground plane and the second conductive plane is a power plane.

27. A printed circuit board comprising:

a capacitor having a first terminal and a second terminal;

a first signal layer, wherein the first signal layer is the outermost layer of the printed circuit board;

a first conductive plane and a second conductive plane, wherein the first conductive plane is arranged between the first signal layer and the second conductive plane;

wherein the printed circuit board includes at least one cavity, wherein the cavity extends from the first signal layer to the second conductive plane, wherein the capacitor is mounted within the cavity; and wherein the first terminal is directly attached to the first conductive plane and the second terminal is directly attached to the second conductive plane.

28. The printed circuit board as recited in claim 27, wherein the first terminal is attached to the first conductive plane by soldering.

29. The printed circuit board as recited in claim 27, wherein the first terminal is attached to the first conductive plane by conductive glue.

30. The printed circuit board as recited in claim 27, wherein the first terminal is attached to the first conductive plane by a pressure contact.

31. The printed circuit board as recited in claim 27, wherein the second terminal is attached to the second conductive plane by soldering.

32. The printed circuit board as recited in claim 27, wherein the second terminal is attached to the second conductive plane by conductive glue.

33. The printed circuit board as recited in claim 27, wherein the second terminal is attached to the second conductive plane by a pressure contact.

34. The printed circuit board as recited in claim 27, wherein the first conductive plane is a power plane and the second conductive plane is a ground plane.

35. The printed circuit board as recited in claim 27, wherein the first conductive plane is a ground plane and the second conductive plane is a power plane.

36. A method for directly attaching a capacitor to conductive planes of a printed circuit board, the method comprising:

providing a printed circuit board, the printed circuit board having a first signal layer, wherein the first signal layer is the outermost layer of the printed circuit board, and wherein the printed circuit board also includes a first conductive plane and a second conductive plane, the first conductive plane arranged between the second conductive plane and the first signal layer;

forming a cavity in the printed circuit board, wherein the cavity extends from the first signal layer to the second conductive plane;

placing a capacitor in the cavity;

directly attaching a first terminal of the capacitor to the first conductive plane; and directly attaching a second terminal of the capacitor to the second conductive plane.

37. The method as recited in claim 36 further comprising attaching the first terminal of the capacitor to the first conductive plane by soldering.

38. The method as recited in claim 36 further comprising attaching the first terminal of the capacitor to the first conductive plane by electrically conductive glue.

39. The method as recited in claim 36 further comprising using a pressure connection to maintain contact between the first terminal of the capacitor and the first conductive plane.

40. The method as recited in claim 36 further comprising attaching the second terminal of the capacitor to the second conductive plane by soldering.

41. The method as recited in claim 36 further comprising attaching the second terminal of the capacitor to the second conductive plan by electrically conductive glue.

42. The method as recited in claim 36 further comprising using a pressure connection to maintain contact between the second terminal of the capacitor and the second conductive plane.

43. The method as recited in claim 36, wherein the first conductive plane is a power plane and the second conductive plane is a ground plane.

44. The method as recited in claim 36, wherein the first conductive plane is a ground plane and the second conductive plane is a power plane.

* * * * *